United States Patent [19]
Kuczynski et al.

[11] Patent Number: 6,060,169
[45] Date of Patent: May 9, 2000

[54] COATING MATERIAL AND METHOD FOR PROVIDING ASSET PROTECTION

[75] Inventors: Joseph Paul Kuczynski; David Otto Lewis, both of Rochester, Minn.

[73] Assignee: International Business Machines Corporation, Armonk, N.Y.

[21] Appl. No.: 08/976,880

[22] Filed: Nov. 24, 1997

[51] Int. Cl.[7] .............................. B32B 15/04; H05K 1/16
[52] U.S. Cl. .................... 428/457; 428/916; 361/751; 361/760; 361/765
[58] Field of Search ........................... 257/679; 428/916, 428/457; 361/751, 760, 765

[56] References Cited

U.S. PATENT DOCUMENTS

| | | | |
|---|---|---|---|
| 4,326,239 | 4/1982 | Ohsawa et al. | 361/765 |
| 4,738,949 | 4/1988 | Sethi et al. | 428/916 |
| 5,309,326 | 5/1994 | Minoru | 361/760 |
| 5,528,368 | 6/1996 | Lewis et al. | 356/346 |

*Primary Examiner*—Cathy F. Lam
*Attorney, Agent, or Firm*—S. Jared Pitts; James E. Lake

[57] ABSTRACT

A material and a method for forming a tamper-indicating identification coating are provided. The components of the coating are selected such that the coating exhibits a characteristic absorption spectrum with distinct features in individual regions during Fourier-transform infra-red (FTIR) spectroscopy. The coating components are selected to provide a distinct spectrum while, at the same time, providing a sufficiently complex spectrum such that the coating is difficult to duplicate. Also, a blowing agent in the coating decomposes to change the FTIR spectrum due to the heat associated with resoldering of an out-of-warranty electronic part marked with the identification coating to an in-warranty circuit card. In addition, the coating may contain a fluorophore to reveal the presence of a tamper-indicating identification coating, allowing a manufacturer to check the card by exposure with ultra-violet (UV) light. Further, the coating composition may be changed periodically and tracked to provide a date marker.

19 Claims, 6 Drawing Sheets

COATING MATERIAL AND METHOD FOR PROVIDING ASSET PROTECTION

BACKGROUND OF THE INVENTION

1. Technical Field

The invention relates to the field of identification markings. More particularly, the invention is a method and composition of matter for forming a tamper-indicating identification coating on electronic parts.

2. Background Art

Electronic goods are prevalent in modem civilization and range from simple toys to high technology computers and other devices. Most electronic goods contain electronic parts that are soldered onto printed circuit cards or boards. Electronic parts range from simple, inexpensive devices to complex, costly integrated circuit chips. As with most goods, electronic goods and parts generally bear a warranty for specified amounts of time, ranging from months to years. The range of time depends on the failure rate and expense of the parts as well as other business considerations such as the quality to be associated with the goods and parts.

Typically, all the parts on a given card bear the same warranty rather than individual parts on the card having separate warranties or warranty periods. Accordingly, if a card becomes defective within the warranty period the entire card is replaced. At times, the part that fails on the card is the most expensive part, such as an integrated circuit chip. When a card that is outside its warranty period becomes defective due to failure of its most expensive part, there is an opportunity and motivation for fraud on the manufacturer of the card. Such cards may bear little or no value depending on the relative cost of the remaining non-defective parts. Typically, cards bear some sort of label or means for tracking the card to determine whether the card is inside or outside of its warranty period. However, a card is made up of multiple small parts that cannot be tracked individually without significant effort and expense. Accordingly, while cards can be identified as outside a warranty, individual parts generally cannot.

Due to the circumstances described above, it is possible for a defective part from an out-of-warranty card to be removed and used to replace the same type of non-defective part on an in-warranty card. The in-warranty card with the out-of-warranty defective part is then sent away for repair or replacement. At times, resoldering of the defective part gives the solder an appearance that differs enough from the original solder for the manufacturer to detect tampering, however, techniques are available to avoid that detection. Unless the fraudulent act is discovered, the manufacturer will pay to repair or replace the card whereas, otherwise, the manufacturer would gain revenue from the sale of a new card. This type of warranty fraud is relatively pervasive throughout the electronics industry.

Turning to FIG. 2, one technique manufacturers are currently using to prevent warranty fraud includes a self-destruct label 200. Self-destruct label 200 is simply a strip of material coated with an adhesive wherein one end of label 200 is adhered to the electronic part (e.g. integrated circuit chip 100) and the other end is adhered to a circuit card 110. Label 200 is sufficiently fragile that, if an attempt is made to remove label 200, it will appear damaged. By this means, tampering is detected, however, the labels are relatively expensive and some labels can be counterfeited. Also, some labels may give a false positive indication of tampering because the label usually spans a gap 210 between chip 100 and card 110. Because of its fragility, the portion of label 200 that spans gap 210 and is not adhered either to chip 100 or card 110 may become damaged just from handling the card 110.

Another current technique involves thermochromic materials, that is, coatings that change color in response to being exposed to a given temperature. Specifically, the techniques for resoldering a defective part onto an in-warranty card expose the part to heat. If the part is coated with a thermochromic material that changes color when the part is exposed to the heat associated with resoldering, then tampering can be detected. However, once the color change occurs, it will be visibly apparent and the part can simply be recoated with any material that restores the original color.

Thus, it can be seen from the above discussion that it would be an improvement in the art to provide an inexpensive, reliable means for detecting the presence of out-of-warranty electronic parts on in-warranty circuit cards. Without a means of detecting when parts have been replaced on a circuit card, the computer and electronics industry will continue to suffer extensive revenue loss due to warranty fraud.

DISCLOSURE OF INVENTION

A preferred embodiment of the present invention provides a material and a method for forming a tamper-indicating identification coating. The components of the coating are selected such that the coating exhibits a characteristic (i.e., nearly unique) absorption spectrum with distinct features in individual regions during Fourier-transform infra-red (FTIR) spectroscopy. All compounds have a highly characteristic absorption spectrum, however, in practice it can be difficult to reliably distinguish one complex compound from another similar compound. Also, in mixtures of compounds, the spectral absorptions of different compounds in the mixture may interfere with one another to yield a spectrum that is difficult to decipher. The coating components are selected to provide a distinct spectrum while, at the same time, providing a sufficiently complex spectrum such that the coating is difficult to duplicate. It may be technically possible to duplicate the spectrum, but duplication can be rendered difficult enough that doing so requires substantial effort, exceeding the value of benefits derived from duplication. Thus, according to a preferred embodiment, the absorption spectrum becomes a sort of "fingerprint" indicative of the presence of a coating having a unique composition known only to the originating manufacturer.

Also, a preferred embodiment provides that at least one blowing agent in the coating decomposes from the heat associated with resoldering of an electronic part marked with the identification coating. If the decomposition is sufficient to change the absorption spectrum of the coating as to at least one distinct feature in at least one individual region, then the identification coating is considered tamper-indicating. That is, if an attempt is made to resolder an out-of-warranty, coated, electronic part onto an in-warranty circuit card or board, then the FTIR spectrum will change to indicate the tampering.

In addition, the coating may contain a fluorophore to reveal the presence of a tamper-indicating identification coating. The fluorophore allows a manufacturer to check the card by exposure with ultra-violet (UV) light, causing the coating to fluoresce whenever a fluorophore-loaded coating is present. By this means a manufacturer can be certain parts have been coated properly before shipping them to customers. Also, a manufacturer can quickly screen out circuit cards returned for repair or replacement that obviously are not coated.

Because a wide variety of components may be selected to yield a suitable "fingerprint" absorption spectrum, the coating composition may be changed periodically to provide a date marker. That is, if the periodic changes in composition are tracked with respect to date of use, then a manufacturer will know approximately when an individual electronic part was coated.

It is an advantage of a preferred embodiment of the present invention that a distinct fingerprint for an identification coating is provided.

It is also an advantage that the fingerprint is difficult to duplicate.

It is a further advantage that the fingerprint is altered by attempts to resolder an out-of-warranty part to an in-warranty circuit card.

It is a still further advantage that the coating includes a fluorophore that will fluoresce when exposed to UV light to reveal the presence of the coating.

It is an additional advantage that the coating composition can be periodically altered to provide a date marker.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, wherein like designations denote like elements, and.

BEST MODE FOR CARRYING OUT THE INVENTION

According to a preferred embodiment of the present invention, a material and a method are provided for forming a tamper-indicating identification coating primarily for use on electronic parts. One important feature of the coating is that its FTIR spectrum is sufficiently unique to act as an identifier of the electronic part manufacturer. Coating components are selected to yield enough distinct features in the spectrum that, even though individual features can be correlated to possible bonds or functional groups, the compound(s) that produce the overall spectrum are not readily apparent. In a preferred embodiment, the components are selected such that the distinct spectrum will be altered by attempts to resolder an out-of-warranty part to an in-warranty circuit card due to the heat exposure. That is, at least one component of the coating decomposes at or below the reflow temperature of the solder used to affix the part to the card. Also, a fluorophore may be incorporated into the coating so that the coating fluoresces when exposed to UV light, allowing detection of the coating's presence before shipping the product or performing FTIR spectroscopy. Additionally, the coating composition can be periodically altered and tracked so that the absorption spectrum provides a date marker. A preferred embodiment of the method and apparatus are described in FIGS. 1 to 6 and the explanation below.

Figure 1:
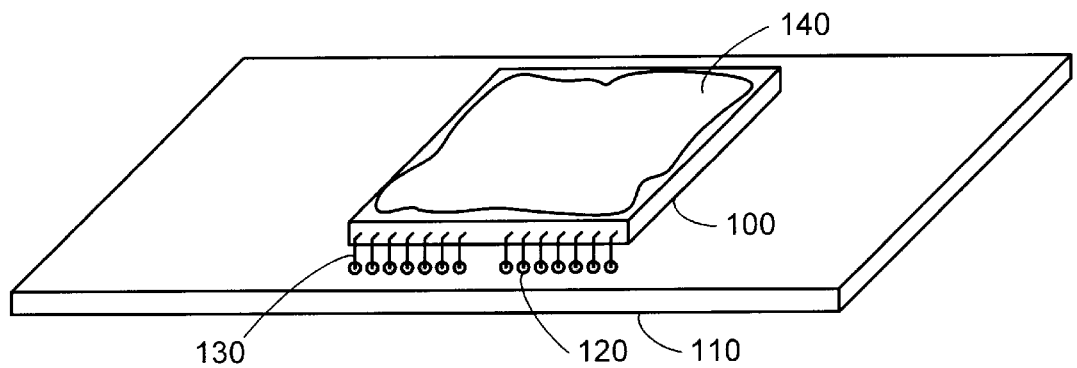
FIG. 1 is a perspective view of an exemplary integrated circuit chip coated according to a preferred embodiment of the present invention.
Figure 2:
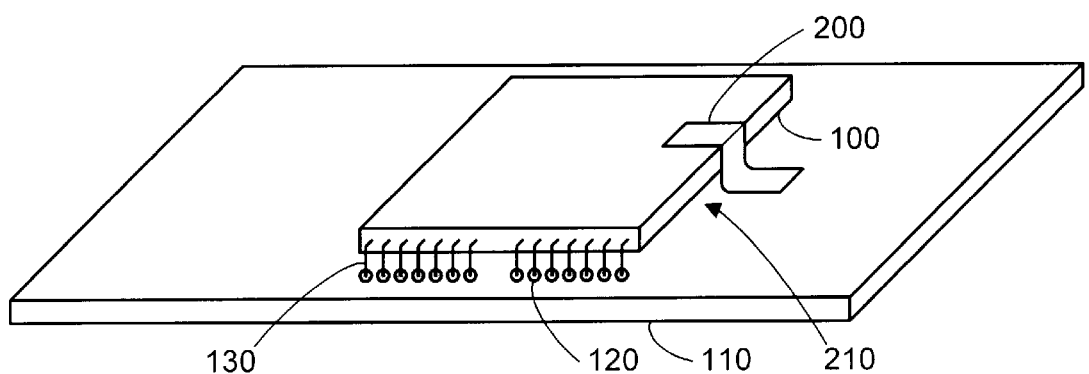
FIG. 2 is a perspective view of an exemplary integrated circuit chip with a self-destruct label.

Referring to FIGS. 1 and 2, an integrated circuit chip 100 is shown affixed to a circuit card 110 with solder 120 connecting each chip lead 130 to card 110. In FIG. 1, a preferred embodiment of the present invention, a tamper-indicating identification coating 140 appears on chip 100. Alternatively, coating 140 may be placed solely on other elements associated with chip 100, such as chip lead 130 or solder 120, or placed on chip 100 along with one or more of the other elements. To most effectively detect an attempt to tamper with chip 100 on card 110, coating 140 need only be located where it will be sufficiently exposed to the heat associated with resoldering, that is, the heat either from removing chip 100 from card 110 or from re-affixing chip 100 to a different card with solder 120.

Figure 3A:
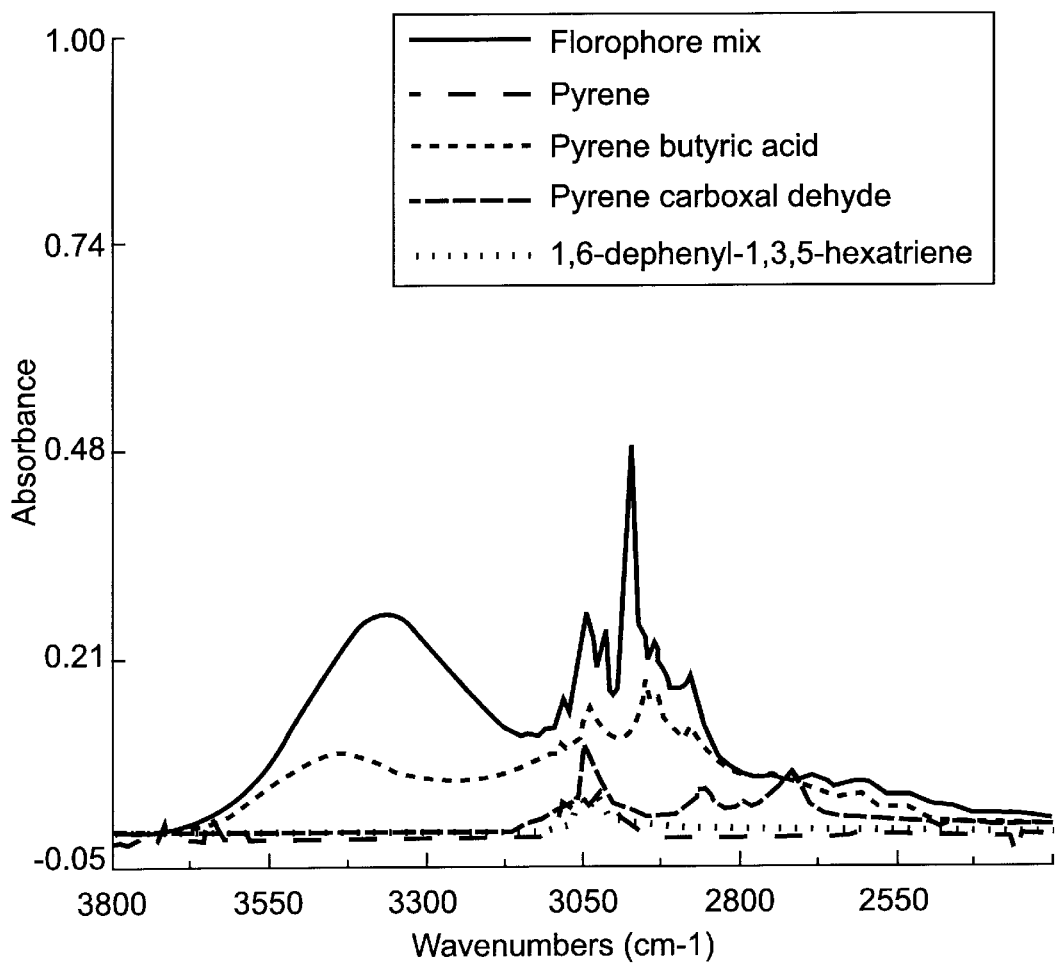
FIG. 3 is an exemplary FTIR absorption spectrum.
Figure 3B:
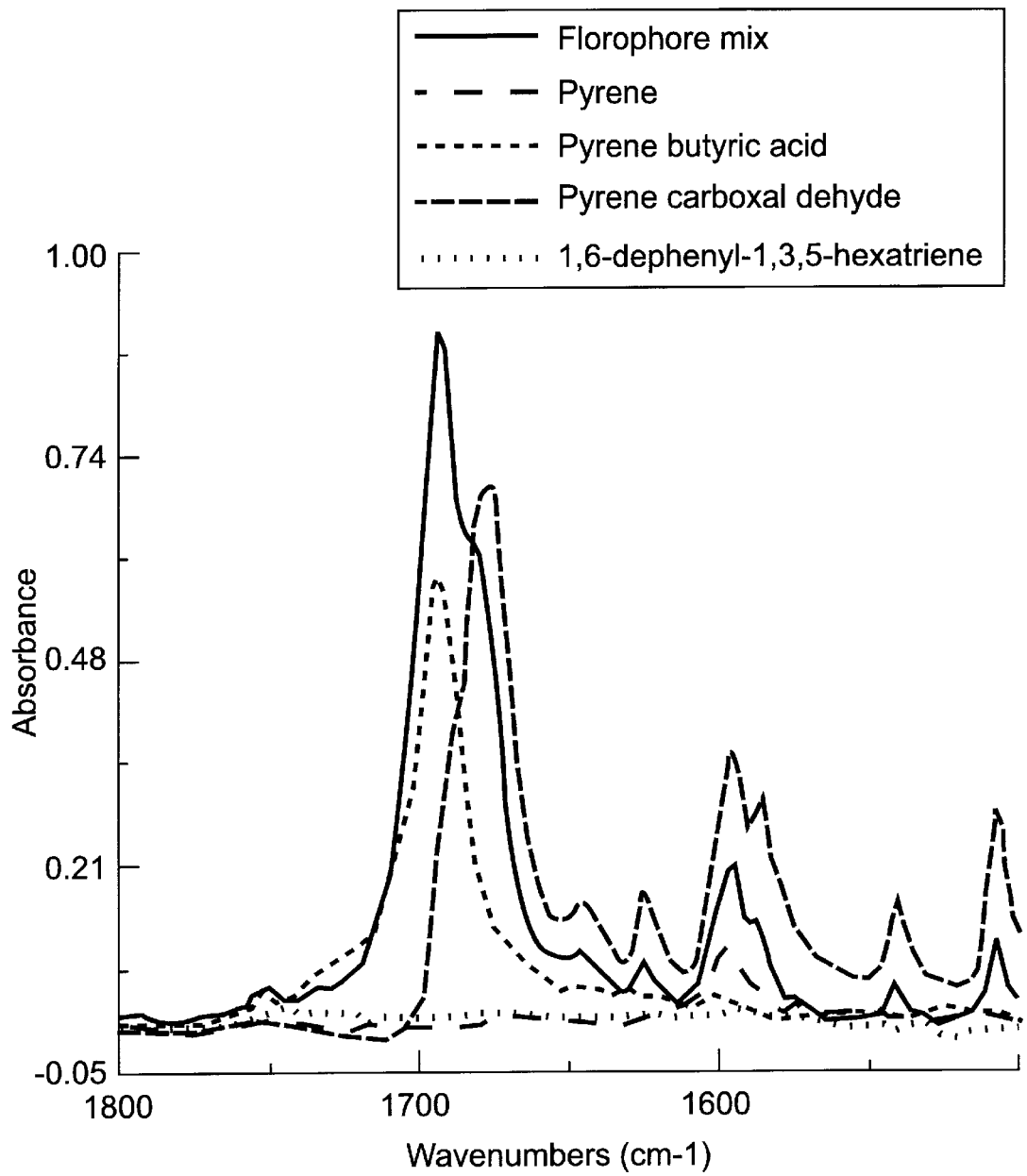

Turning to FIG. 3, an example of an FTIR absorption spectrogram is shown. Every compound has a highly characteristic absorption spectrum in the IR region of light and, for this reason, an IR absorption spectrum is sometimes compared to a "fingerprint". However, in practice it can be difficult to reliably distinguish the spectrum of one complex compound or mixture of compounds from the spectrum of another similar compound or mixture. Additionally, it can be very difficult to reliably back-calculate the specific compound that produces a given spectrum when the spectrum is somewhat complex. This is because a compound evaluated by FTIR spectroscopy will produce an absorption spectrum that accounts for all its covalent bonds. Each covalent bond will absorb IR radiation within a given frequency. The frequency range depends on the two atoms between which the bond exists and the other types of atoms that may be additionally bonded to the two atoms. For example, the three identical C—H bonds in the group —O—$CH_3$ absorb to produce multiple peaks in a spectrogram between 2850 and 2810 $cm^{-1}$. However, the two identical C—H bonds in the group —O—$CH_2$—O— absorb to produce multiple peaks between 2790 and 2770 $cm^{-1}$.

The spectra recorded in FIG. 3 demonstrate the highly characteristic nature of IR absorption spectra. Illustrated are the spectra for three pyrene derivatives, an unsaturated hydrocarbon, and an equimass mixture of all four. The lower spectrogram covers the spectral range characteristic of O—H and C—H stretching vibrations (3800–2500 $cm^{-1}$). Of the four fluorophores, only pyrenebutyric acid exhibits an O—H stretch, occurring at about 3425 $cm^{-1}$, but it also appears in the spectrum for the fluorophore mix. Interestingly, viewing the lower spectrogram by scanning from left to right, or from high to low wavenumbers, it is apparent that every resonance present in either one or more of the individual fluorophores is also evident in the mix spectrum. This feature is also indicated in the upper spectrograph covering the spectral range of 1800–1550 $cm^{-1}$. Of particular interest is the carbonyl stretching frequency (1700–1680 $cm^{-1}$). The C=O stretch in the spectra for pyrene butyric acid and pyrenecarboxaldehyde is fairly well resolved when each spectrum is viewed individually. However, the C=O stretch appears as a single peak with a shoulder in the mix spectrum.

To aid in the identification of individual bonds and functional groups having several bonds, numerous reference sources have been compiled documenting common absorption spectra. One such table exists in *Lange's Handbook of Chemistry* 8-63 to 8-76 (John A. Dean ed., 13$^{th}$ ed. 1985). However, as readily observed from FIG. 3 and in the above mentioned tables and other similar tables or charts of accumulated absorption data, the spectra of different bonds and functional groups may occur at similar frequencies. Accordingly, the individual spectra may overlap or interfere with one another to yield an overall spectrum for a given compound that is difficult to decipher.

In a preferred embodiment of the present invention, the coating components are selected to provide distinct features in individual regions of the spectrum so that the overall spectrum is characteristic of a particular mixture. Nevertheless, while a distinctly characteristic spectrum is provided, components are also selected to also provide a sufficiently complex spectrum such that the coating 140 is difficult to duplicate. In other words, there are enough distinct features in the spectrum that, even though individual features can be correlated to possible bonds or functional groups, the compound(s) that produce the overall spectrum are not readily apparent. It may be technically possible to duplicate the spectrum after significant investigation, but duplication is rendered difficult enough that investigation requires substantial effort exceeding the value of benefits derived from duplication. Thus, according to a preferred embodiment, the absorption spectrum becomes a sort of "fingerprint" indicative of the presence of a coating 140 having a distinct composition known only to the originating manufacturer.

Secrecy regarding the composition of coating 140 is desirable so that the manufacturer can use coating 140 in preventing warranty fraud. By checking the FTIR spectrum of coating 140, a manufacturer can determine whether a coated electronic part originated from the manufacturer or is a counterfeit product. Obviously, if a defective electronic part is a counterfeit, then a manufacturer will not want to bear the expense of repairing or replacing the part. A more prevalent type of warranty fraud occurs when an out-of-warranty part is passed off as being within warranty by resoldering the part to an in-warranty circuit card from the same manufacturer.

At times, one of the electronic parts, such as an integrated circuit chip, fails on an out-of-warranty circuit card. Generally, any warranty limitation applies to the whole card and its individual parts, so the integrated circuit chip, one of the most expensive parts on the card, would also be out-of-warranty. The card owner will be responsible for the full cost of any repair or replacement and the card may bear little or no value depending on the relative cost of the remaining non-defective parts. Although the card may bear some sort of label or means for tracking the card to determine whether the card is inside or outside of its warranty period, individual parts usually are not tracked individually. Accordingly, manufacturers have encountered in-warranty cards wherein a failed part has been resoldered. Presumably a failed out-of-warranty part was removed from an out-of-warranty card and used to replace a working chip on an in-warranty card.

To overcome the trouble of resoldered parts, a preferred embodiment of the present invention provides a coating that has a characteristic fingerprint known only to the manufacturer and also provides a tamper-indicating feature. One way to provide a tamper-indicating feature is to include in the coating composition a compound that decomposes from the heat associated with resoldering. Most parts are originally affixed to a card with solder so, removing the part usually requires reheating the solder to its reflow temperature, typically about 200° C. Also, reaffixing the removed part to another card requires applying solder to the part again. The steps of reflowing and reaffixing may sometimes be accomplished with a soldering iron to avoid exposing the part to the full reflow temperature of the solder. However, the aesthetic quality of the solder will differ noticeably from the original solder and manufacturers can easily detect the resoldering. Techniques, such as surface mount wave soldering, exist that yield a solder connection not readily detected as resulting from resoldering. Nevertheless, such precise techniques require exposing the entire part to elevated temperatures. If a tamper-indicating compound is included in a part coating, then the compound will decompose sufficiently during resoldering to change the FTIR spectrum of coating 140. With the spectrum changed, a manufacturer can easily detect resoldering by performing FTIR analysis prior to repair or replacement.

Typically, a sufficient decomposition is one wherein the tamper-indicating compound gives off a gaseous product that will escape from coating 140 on the part. A gaseous product is preferred, since it will clearly alter the coating spectrum, although other decomposition products may be sufficiently different to change the spectrum also. A preferred embodiment of a tamper-indicating compound is at least one blowing agent in the coating composition. Blowing agents are compounds used in the manufacture of structural polymer foam, acting as a sort of baking soda for plastics wherein the material simultaneously expands in a mold and cures. However, in a coating for electronic parts a blowing agent is used because it is the type of compound that will decompose at specified temperatures to yield a gaseous product. Blowing agents are readily available in commercial form ready for mixing with other coating components and the physical characteristics of blowing agents are well published as a result of their frequent use in making polymer foam products. Exemplary blowing agents include azodicarbonamides, sulfonyl hydrazides, sulfonyl semicarbazides, esters of azodicarboxylic acid, and salts of azodicarboxylic acid. In selecting a blowing agent or other tamper-indicating compound, it is most preferred that the decomposition is sufficient to change the absorption spectrum of coating 140 as to at least one distinct feature in at least one individual region. In this manner, any attempt to resolder an out-of-warranty, coated, electronic part onto an in-warranty card will be readily apparent from the resulting FTIR spectrum of coating 140.

In a preferred embodiment of a tamper-indicating identification coating, the composition also includes a fluorophore to reveal the presence of coating 140. It is conceivable that the presence of coating 140 on a part or on the solder affixing the part to the card may not be readily apparent. This may result from coating 140 being transparent, applied in a thin layer, or the same color as the coated part. Not being able to easily perceive the coating's presence is an advantage since it will prevent raising suspicion, however, it will also be difficult for the manufacturer to inspect for proper application of coating 140. A fluorophore allows a manufacturer to check the card by exposure with ultra-violet (UV) light, causing coating 140 to fluoresce. Exemplary fluorophores include pyrene, pyrene butyric acid, pyrene carboxaldehyde, 1,6-diphenyl-1,3,5-hexatriene, and 2,5-diphenylfuran. Fluorophores may also be used that fluoresce under IR light or other regions of light. By including a fluorophore in the coating, a manufacturer can ascertain whether parts have been coated before shipping them to customers.

A fluorophore may also be helpful when receiving circuit cards returned for repair or replacement. First, coated parts can be readily identified for later submission to FTIR spectroscopy. Second, it may be desirable and possible to chose a tamper-indicating compound that is also a fluorophore. A dual purpose compound that is both tamper-indicating and fluorescent provides a quick indication of tampering without submitting a part to FTIR. A coating that includes a dual purpose compound will not fluoresce once the part has been resoldered. Simply illuminating the card with UV light will reveal tampering. However, even if the part fluoresces, it may still have been tampered with and must be checked by FTIR. That is, it would be possible for a card owner to detect that the part had a fluorescent coating, resolder the part, and then recoat with a fluorescent coating. While the part will fluoresce during a quick check with UV light, it is very unlikely that the recoat material will have an FTIR spectrum matching that of the identification coating, even if the same fluorophore is by chance selected.

EXAMPLE 1

Figure 4:
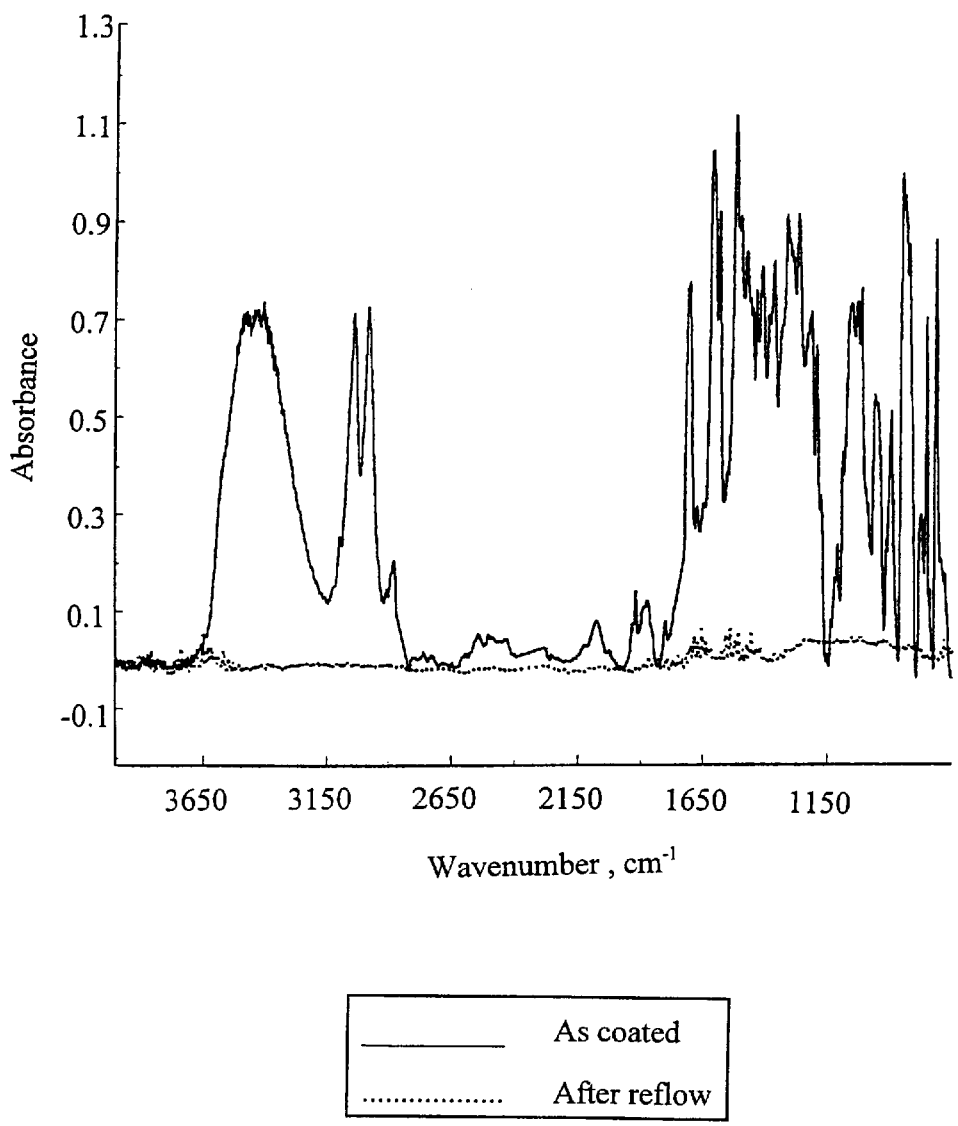
FIG. 4 is an overlay of two FTIR absorption spectrograms, one before and one after solder reflow.

FIG. 4 displays an FTIR absorption spectrogram for a tamper-indicating identification coating. The coating was prepared by dissolving PKHC resin (available from Phenoxy Associates, Rock Hill, S.C.) in an appropriate volume of methyl ethyl ketone (MEK) or some other suitable solvent, then by dissolving the remaining constituents indicated below in the PKHC solution to yield the following composition:

PKHC resin, 59.2 wt %;
Celogen® TSH (a foaming agent available from Uniroyal Chemical Co., Middlebury, Conn.), 13.0 wt %;
2,5-diphenylfuran, 13.7 wt %; and
pyrene, 14.1 wt %, wherein PKHC resin was the carrier, Celogen® TSH was the blowing agent, and 2,5-diphenylfuran and pyrene were both fluorophores. The composition viscosity was controlled by adjusting the solvent volume to yield the desired viscosity. A suitable aliquot of the composition was dispensed on the solder leads of a chip. Visual inspection of the composition under UV light verified that the chip leads had been coated. FTIR analysis of the coating was performed to identify its "fingerprint" indicated in FIG. 4 and then the chip was subjected to a typical rework process (solder reflow). A second FTIR analysis, also shown in FIG. 4, revealed that the solder reflow nearly eliminated the distinct features of the FTIR fingerprint in its individual regions.

Although the coating used in EXAMPLE 1 contained tamper-indicating compounds, FIG. 4 indicates that a coating may be tamper-indicating without including a tamper-indicating compound. In EXAMPLE 1, the coating was applied to the solder leads of a chip and when the solder was reflowed, the coating dissolved into the bulk of the solder. Clearly, the decomposition of the coating compounds contributed to the elimination of the distinct FTIR features, however, the dissolving of the coating also contributed. Because the coating dissolved, only a small amount was present from which to obtain an FTIR reading. Accordingly the spectrum displayed in FIG. 4 is rather weak and is difficult to discern above the background noise produced by IR reflection from the solder. In practice, when an identification coating is applied directly to solder, a tamper-indicating feature will exist provided the coating dissolves into the solder sufficiently to produce a different distinct feature in at least one individual region. Thus, compounds may be used that do not decompose at the reflow temperature and tampering can still be detected. The presence of a decomposing compound simply guarantees that the spectrum after reflow will be sufficiently different to detect tampering.

The composition of coating 140 may also be modified to provide a date marker. The nature of coating 140 allows a wide variety of compounds to be selected to yield a suitable "fingerprint" absorption spectrum, including the compounds that provide a tamper-indicating feature or fluorescence. That is, if the periodic changes in composition are tracked with respect to date of use, then a manufacturer will know approximately when an individual electronic part was coated. For example, at the end of each period one could select a different tamper-indicating compound, a different fluorophore, a different blowing agent/fluorophore pair, or some other compound that would change the spectrum sufficiently. Again, it is preferred that the spectrum change by at least one distinct feature in at least one individual region.

It may even be possible to provide a date marker by keeping the list of components constant, but changing only the amount of one or more components. As long as a component is present, even in a small amount less than 1%, the FTIR will identify its presence, however, depending on the compound, the FTIR response may not be sufficient to produce a distinct feature in the spectrogram. For best results, it is preferred that any component expected to contribute to the spectrogram be present at an amount of 5% or greater and 10% or greater is most preferred. Amounts beyond 10% do not improve the accuracy nor precision of the spectrogram in yielding distinct features. Within these guidelines the amounts of components may be modified periodically to provide a date marker. For example, the amount could be altered each period for a tamper-indicating compound, a fluorophore, a blowing agent/fluorophore pair, or some other compound that would change the spectrum sufficiently.

Notably, the date marking feature may be used independent of the tamper-indicating feature. There may exist applications for a date marking coating where it is used only as a tracking agent by periodically changing the coating composition. For example, when there is only a need to identify whether the part was built within one range of dates or another. Such a circumstance might exist when tampering with the part comprises changing a date stamp or some other indication of manufacturing date that can be easily counterfeited to circumvent warranty limitations. A coating according to the present invention with a simple date marker would be difficult to counterfeit and provide detection for out-of-warranty parts.

Figure 5:
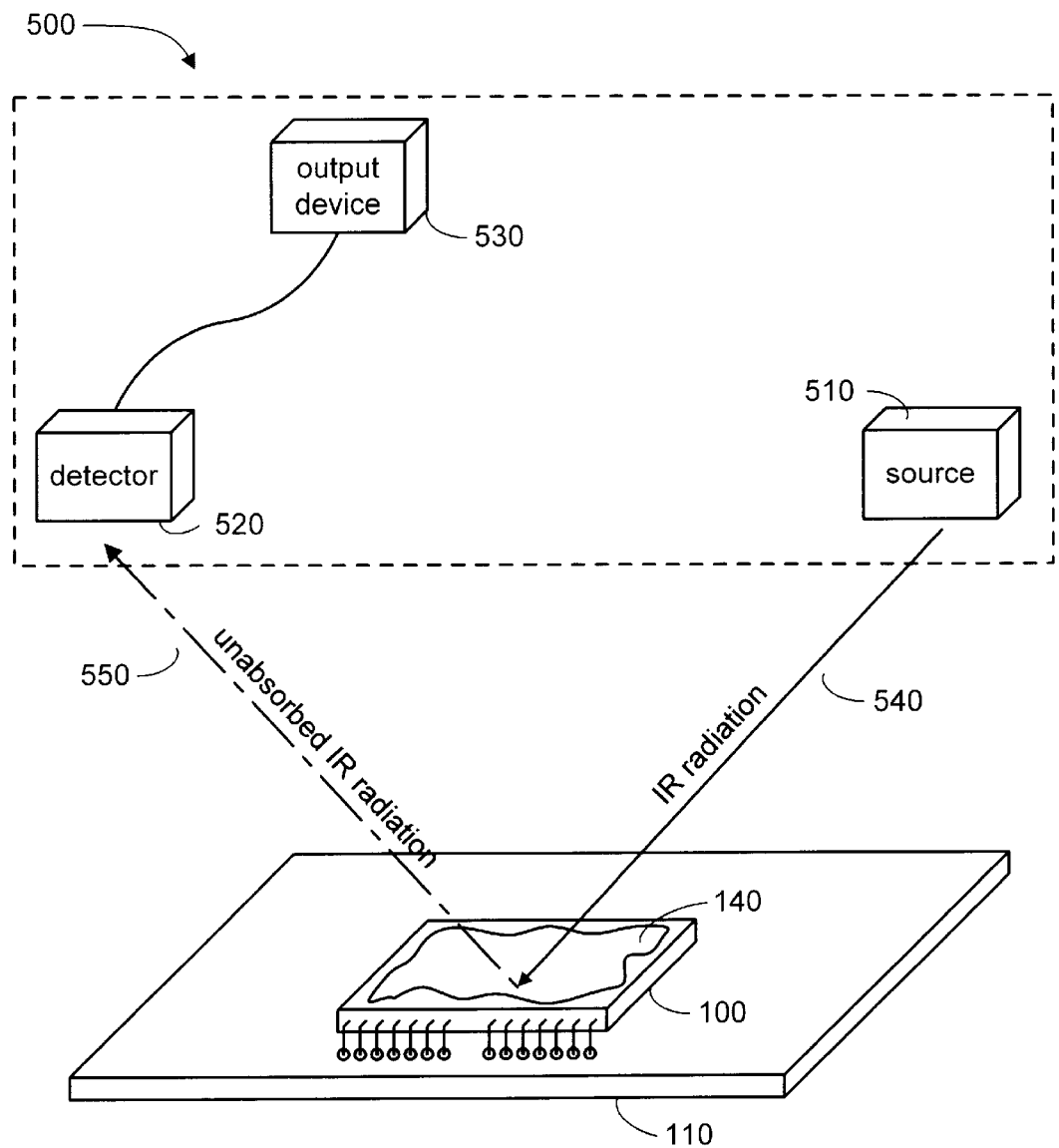
FIG. 5 is a diagram of an apparatus used to measure the FTIR absorption of a coating on an electronic part.

Turning to FIG. 5, an apparatus for practicing an inspection method according to a preferred embodiment of the present invention is provided. The apparatus is essentially a conventional FTIR spectrometer 500 capable of performing spectrographic analysis according to a preferred embodiment of the present invention. In its basic form, FTIR spectrometer 500 has three elements: an IR radiation source 510, an IR radiation detector 520, and an output device 530. Typically, source 510 is an electrically heated rod that emits continuous radiation and detector 520 could be thermocouples, temperature-dependent resistors, photoconductive materials, or other devices. Numerous types of IR spectrometers are commercially available, however, FTIR spectrometer 500 was selected for a preferred embodiment of the present invention because of its ability to detect weak signals and to quickly analyze solid samples on intact electronic parts. Essentially, source 510 emits IR radiation 540 toward a coating 140 on an integrated circuit chip 100 affixed to a circuit board 110. Coating 140 will absorb a portion of IR radiation 540 and the remaining unabsorbed IR radiation 550 will be reflected to detector 520. Data from detector 520 is transmitted to output device 530 for processing and display. In FTIR, processing involves mathematical manipulation by a microcomputer before a spectrum can be displayed. An FTIR spectrometer 500 suitable for most applications is likely to be commercially available and may already be in use serving other purposes for manufacturers of electronic parts and circuit cards. Several reference sources are available on FTIR spectroscopy, including P. R. Griffiths and J. A. de Haseth, *Fourier Transform Infrared Spectrometry* (1986).

Other IR spectrometers may be used according to the present invention but are not preferred. Other IR spectrometers may require dissolving coating 140 on the part into solution for analysis or may not possess sufficient sensitivity to yield a distinct spectrum for coating 140. Similarly, other types of spectrographic, or even chromatographic, analysis may be used, such as nuclear-magnetic-resonance spectroscopy, Raman spectroscopy, mass spectroscopy, or gas chromatography. FTIR spectroscopy is based on absorption of IR radiation by coating 140, however, the alternative analytical techniques could be based on emission or scattering of energy or light or still other properties of coating 140. All that is necessary is for the analytical technique to enable distinguishing the original coating from a tampered coating or counterfeit coating. Typically, comparison of a spectrum from a coating to a reference spectrum for the original coating constitutes a preferred analytical technique.

Figure 6:
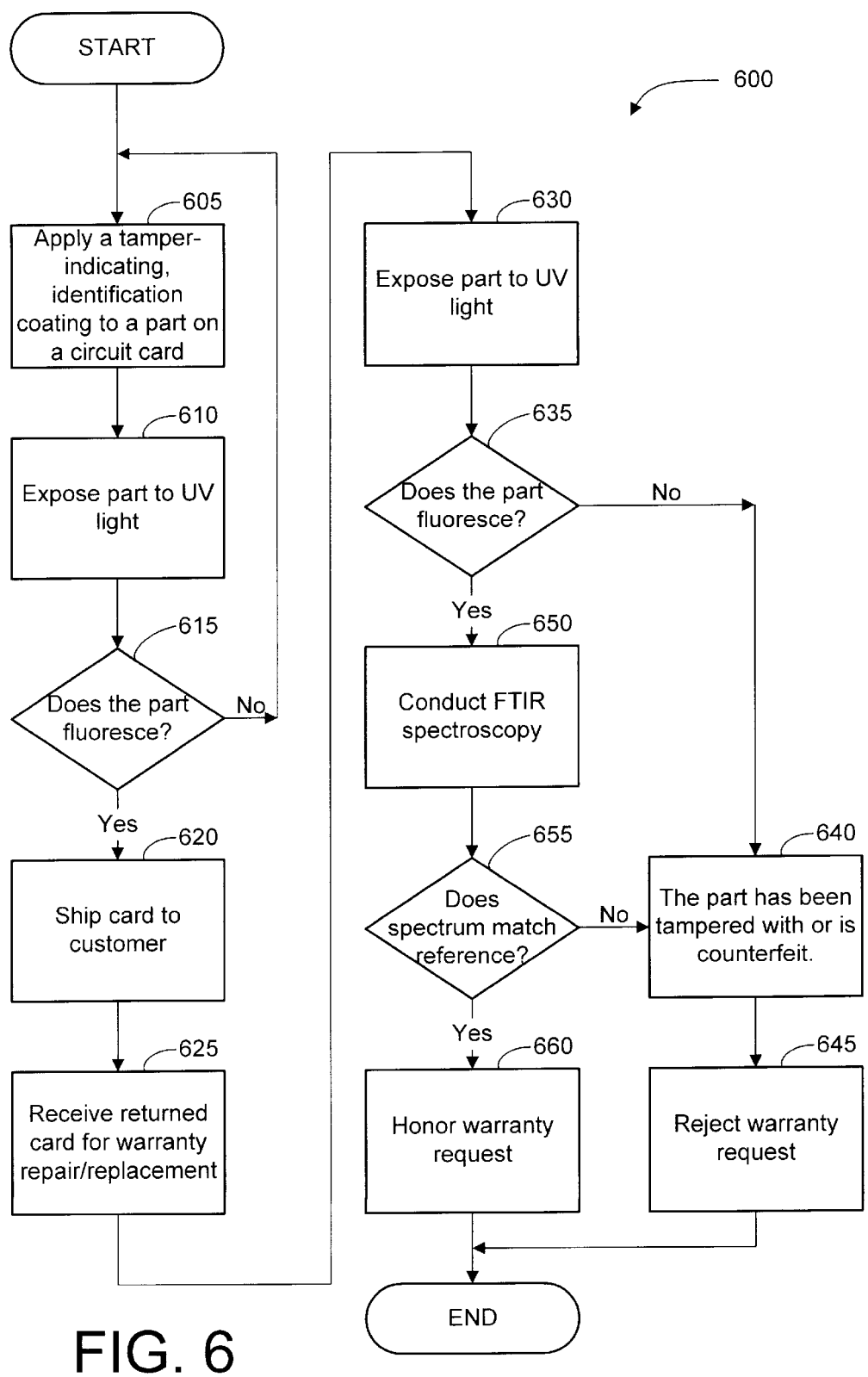
FIG. 6 is a flow diagram of a method for marking and identifying an electronic part according to a preferred embodiment of the present invention.

Referring to FIG. 6, a method 600 of marking and identifying an electronic part is shown. Step 605 involves applying a tamper-indicating identification coating 140 according to a preferred embodiment of the present invention to a part on a circuit card 110. Typically, the part will be an integrated circuit chip 100, but coating 140 could be applied to either chip 100, chip lead 130, or solder 120 as discussed above. Also, method 600 involves a coating 140 that includes a fluorophore. Accordingly, step 610 of exposing the part to UV light allows a manufacturer to determine whether the part fluoresces in step 615. If the part does not fluoresce, then coating 140 or its application may be defective so steps 605 to 615 are repeated. If the part fluoresces, then the card is ready for shipment to a customer as in step 620.

Step 625 in FIG. 6 occurs when a customer returns a card to a manufacturer or authorized servicing agent for warranty repair or replacement and is followed by steps 630 to 660, involving verification of card 110 and chip 100 authenticity. Step 630 of exposing the part to UV light allows a manufacturer to determine whether the part fluoresces in step 635. If the part does not fluoresce, then the part might not bear coating 140, indicating that it is a counterfeit. Alternatively, if the fluorophore in coating 140 is also the tamper-indicating compound, then lack of fluorescence in step 635 is an indication of tampering. In other words, the fluorophore decomposed to a nonfluorescent form during exposure to the heat associated with resoldering. In either case, if the part does not fluoresce, then the conclusion follows in step 640 that the part has been tampered with or is counterfeit. Since the part is not authentic, the warranty request should be rejected in step 645.

Continuing with method 600 in FIG. 6, if the part does fluoresce in step 635, then the part should be subjected to FTIR spectroscopy according to step 650. Simply fluorescing does not indicate authenticity since a counterfeit fluorophore could be applied to chip 100 that fluoresced under UV light in step 635 just as the original fluorophore. In step 655, the FTIR spectrum indicated in the spectrogram that results from step 650 is compared to a reference spectrum for inconsistencies. If the spectra do not match, then the part may be considered tampered with or counterfeit in step 640 and the warranty request rejected in step 645. To avoid false indications, it is preferred, as indicated above, that the coating composition is selected such that tampering causes a change in the spectrum of at least one distinct feature in at least one individual region. More preferably, tampering may cause a change of multiple distinct features, perhaps in multiple regions. However, if the spectra match sufficiently, then the warranty request should be honored as in step 660.

Although method 600 is particularly well-suited for marking and identifying electronic parts on circuit cards, the principles described herein also apply to other apparatus and parts. For example, identification coating 140 could be applied to mechanical apparatus or parts for later detection of counterfeit parts. Of course, such a use might be precluded if coating 140 wears off during normal use of the mechanical apparatus. Also, the tamper-indicating feature of a preferred embodiment can be used alternatively as an over-heating indicator. For example, if a mechanical part is particularly heat sensitive and a manufacturer wants to know whether a part submitted for repair was subjected to overheating, then a coating 140 may be applied with a component that decomposes at some maximum allowable temperature. A change in the coating spectrum will thus indicate overheating.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. An apparatus comprising:
   a device; and
   a tamper-indicating identification coating on the device, the coating exhibiting a first absorption spectrum.

2. The apparatus of claim 1, wherein, upon heating said coating at least to a decomposition temperature, at least one component of said coating decomposes sufficiently for the coating to exhibit a second spectrum different from the first absorption spectrum.

3. The apparatus of claim 1, wherein said coating has a composition that is periodically changed and tracked to provide a date marker.

4. The apparatus of claim 1, wherein said device is affixed to a circuit card with a solder and said coating is affixed at least to the solder.

5. The apparatus of claim 4, wherein said solder has a reflow temperature and wherein said coating is capable of dissolving into the solder upon heating to the reflow temperature.

6. The apparatus of claim 2, wherein said first and second spectrums are Fourier-transform infra-red absorption spectrums and said second spectrum is different from said first spectrum as to at least one distinct feature in at least one individual region of said first spectrum.

7. The apparatus of claim 2, wherein said coating comprises at least one blowing agent that decomposes sufficiently for said coating to exhibit said second spectrum.

8. The apparatus of claim 7, wherein said coating comprises at least one fluorophore.

9. The apparatus of claim 8, wherein said device is affixed to a circuit card with a solder and said coating is affixed to said device, to the solder, or to both said device and the solder.

10. The apparatus of claim 9, wherein said solder has a reflow temperature and wherein at least one blowing agent, at least one fluorophore, or both decompose at a temperature no greater than the reflow temperature.

11. The apparatus of claim 10, wherein said reflow temperature is 200° C.

12. An apparatus comprising:
   a device; and
   an identification coating on the device, the coating exhibiting a first absorption spectrum and having a composition that is periodically changed and tracked such that the coating exhibits a second absorption spectrum to provide a date marker.

13. The apparatus of claim 12, wherein said first and second spectrum is a Fourier-transform infra-red absorption spectrum and said second spectrum is different from said first spectrum as to at least one distinct feature in at least one individual region of said first spectrum.

14. The apparatus of claim 12, wherein said device is affixed to a circuit card with a solder, said coating is affixed at least to the solder, said solder has a reflow temperature, and said coating is capable of dissolving into the solder upon heating to the reflow temperature.

15. An apparatus comprising:
   a device affixed to a circuit card with solder; and
   a tamper-indicating identification coating affixed to the device, to the solder, or to both the device and the solder,
      wherein the coating exhibits a first Fourier-transform infra-red absorption spectrum;
      wherein the coating includes at least one blowing agent and at least one fluorophore;
      wherein the solder has a reflow temperature; and
      wherein, upon heating the coating to a decomposition temperature less than or equal to the reflow temperature, at least one blowing agent, at least one fluorophore, or both decompose sufficiently for the coating to exhibit a second Fourier-transform infra-red absorption spectrum different from the first spectrum as to at least one distinct feature in at least one individual region of the first spectrum.

16. The apparatus of claim 15, wherein said reflow temperature is 200° C.

17. The apparatus of claim 15, wherein said coating has composition that is periodically changed and tracked to provide a date marker.

18. A composition comprising a tamper-indicating identification coating material,
   wherein the coating exhibits a first Fourier-transform infra-red absorption spectrum;
   wherein the coating includes at least one blowing agent and at least one fluorophore; and
   wherein, upon heating the coating to a decomposition temperature, at least one blowing agent, at least one fluorophore, or both decompose sufficiently for the coating to exhibit a second Fourier-transform infra-red absorption spectrum different from the first spectrum as to at least one distinct feature in at least one individual region of the first spectrum.

19. The composition of claim 18, wherein the decomposition temperature is no greater than 200° C.

* * * * *